United States Patent Office 3,269,881
Patented August 30, 1966

3,269,881

HYDROGEN PEROXIDE ETCHING OF COPPER IN MANUFACTURE OF PRINTED CIRCUITS

Carmelo L. Alderuccio, Camillus, Lawrence P. Gould, Syracuse, and Harold F. Jones, Marcellus, N.Y., assignors to Allied Chemical Corporation, New York, N.Y., a corporation of New York No Drawing. Filed Dec. 30, 1963, Ser. No. 334,549
5 Claims. (Cl. 156—3)

This invention relates to hydrogen peroxide as an etchant for copper, and more particularly to the use of acid-hydrogen peroxide solutions as an etchant for copper in the manufacture of printed circuits.

Etching or chemical milling of various metals is a well-known art having a broad range of applications. A specific area of application involves the etching of copper metal in the manufacture of printed circuit boards for the electronics industry. Briefly outlined, the manufacture of printed circuits involves the making of a laminate of copper and a sheet of electrically resistant material which is usually a plastic. The exposed copper surface of the copper-plastic laminate is covered with a protective masking material applied in such a way that it conforms to the pattern of the conductive circuits desired in the board. The remaining exposed copper surfaces are then removed from the board to form the desired conductive pattern by subjecting to the action of a chemical milling agent such as a copper etchant which reactively attacks the copper. The copper to be removed is dissolved away by the etchant exposing the underlying plastic base which separates the elements of the then formed conductive pattern on the board.

The etching of copper metal for a constructive purpose as in the manufacture of printed circuits is not a simple matter and involves several considerations if it is to be a practical success. Among the more important considerations are rate of attack of the etchant, control of the etchant, stability and efficiency of the etchant, time and temperature conditions, effect of the etchant on the materials forming the printed circuit board including the masking material, and effect on the equipment employed in the etching process. Printed circuit etching generally has been carried out with an aqueous ferric chloride solution which has been satisfactory at least in its ability to efficiently etch copper without material adverse side effects. However, in more recent times, the disposition of the spent ferric chloride etchant solution containing both iron and copper has become a problem, largely because of the disposal of the waste liquor and difficulty in recovering copper therefrom which is of course desirable from a cost standpoint. Other copper etchants have therefore been sought with the result that aqueous solutions of ammonium persulfate have been adopted by some users. This etchant permits electrolytic recovery of copper from the spent etchant solution and eliminates the problem of disposing of metal containing waste liquors. However, ammonium persulfate as an etchant is a premium material because of its low etching capacity and is subject to other drawbacks which have left considerable room for improvement in the provision of an etchant for copper.

As an etchant for copper, aqueous hydrogen peroxide would be very attractive because of its relatively low cost and ability to recover copper electrolytically from a spent peroxide etchant solution. However, the utilization of hydrogen peroxide for a constructive purpose in metal etching is a particularly difficult problem. Metals which are attacked by hydrogen peroxide are depreciated at unpredictable rates and the attack is often incomplete, the reasons for which were not ascertainable and consequently hydrogen peroxide has had at best limited use commercially. An additional problem in the use of hydrogen peroxide generally is stability of the compound which may vary considerably depending upon the environment in which it is placed. In the presence of most metals hydrogen peroxide is known to be more or less unstable even though provision has been made to prevent or arrest decomposition of the compound. Such instability becomes a problem of major importance in the use of hydrogen peroxide as an etchant for metal and particularly with copper because of the formation of active copper ions which have been found to have a highly depreciating effect on hydrogen peroxide. Such factors represent problems of major importance in copper etching wtih hydrogen peroxide and a practical, satisfactory method of etching copper with hydrogen peroxide for a constructive purpose as in the manufacture of printed circuits has not been heretofore provided.

An object of the present invention is to provide a new and improved etchant based on hydrogen peroxide.

Another object of the invention is to provide a new and improved method for etching copper metal.

A further object is to provide a practical, efficient method for etching copper for a constructive purpose as in the manufacture of printed circuits.

Other objects and advantages will be evident from the following description of the invention.

In accordance with the present invention it has been found that copper metal may be treated chemically for a constructive purpose under a combination of controlled conditions involving contacting the copper metal for a period of time between about ¼ to 60 minutes with a solution of 2–12% by weight hydrogen peroxide, preferably 2–10% hydrogen peroxide, and 2–23% by weight sulfuric acid, preferably 3–20% sulfuric acid, in water having a total free chloride and bromide ion content less than about 2 parts per million, preferably less than 1 part per million and a temperature between about 40–65° C., preferably between about 50–62° C. The present invention for treating copper metal has several particularly desirable features including: (1) the provision of a method for etching copper in a practical manner at high etch rates significantly greater than those heretofore realized with ammonium persulfate; (2) waste liquors from the treatment of copper by the invention may be readily treated electrolytically to remove and recover dissolved copper; (3) the method of the invention permits accurate, controlled and efficient etching of copper clad laminates used in the manufacture of printed circuit boards; and (4) the invention also provides a new and improved copper etchant comprising a solution of 4–12% by weight hydrogen peroxide, preferably 5–10% by weight, and 2–23% by weight sulfuric acid, preferably 3–20% by weight, in water having a total free chloride and bromide ion content less than 2 parts per million, preferably less than 1 part per million. The copper etchant provided by the invention also has the further particularly desirable advantage of a prolonged life in that it is effective for practical use after dissolving large amounts of copper, as much as 7 ounces per gallon of etchant, and even substantially greater.

The chemical treatment of copper in accordance with the invention requires that a number of conditions be satisfied and in close careful control. For example, it has been unexpectedly found that the free chloride and bromide ion content of the hydrogen peroxide etchant solution is so significant as to alone make the difference between failure and practical success in etching copper. By reducing the total free chloride and bromide ion content of the etchant solution to a very low level less than about 2 parts per million, desirably less than 1 part per million, it has been found that etch rates are substantially increased as much as 4 times the etch rates realized at higher chloride and bromide concentrations. Special consideration must therefore be given in makeup of hydrogen peroxide etchant solution to eliminate any substantial amounts of chloride and bromide ions which may be introduced by the hydrogen peroxide, sulfuric acid or water which are usually employed in preparation of the solution. Generally, commercial hydrogen peroxide contains little or none of these contaminants. Sulfuric acid may contain varying amounts depending on the grade employed and is preferably selected such that the amount of chloride or bromide ion in the acid will not, after dilution with the other etchant components, increase the amount of contaminants above the desired level. In makeup of the hydrogen peroxide etchant solution substantial amounts of water are usually employed and this component requires the greatest consideration as ordinary water contains free chloride and bromide ions in amounts sufficient to introduce a concentration well above the required minimum. One mehod of insuring the desired minimum total chloride and bromide ion content is by specially treating the water used in makeup of the etchant to remove these contaminants. For example, ordinary water may be treated by deionization which is a well-known method for removing many of the free ions in water including the chloride and bromide ions. As it is the free chloride and bromide ions which interfere with copper etching they may be eliminated by precipitation or complexing with suitable reagents and the resulting insoluble chloride salts or chloride complexes permitted to remain in the etchant solution. The reason why the chloride and bromide ion have an adverse effect on hydrogen peroxide copper etching is not known. However, it has been found that many other ions such as those present in ordinary water have substantially no adverse effect on the chemical treatment of copper with hydrogen peroxide. For example, minor amounts of ions of metals such as magnesium, manganese, sodium, potassium, lithium, barium, calcium, iron and aluminum can be tolerated in the etchant solution. Of interest is the fact that other halogen ions such as the fluoride and iodide ions have virually no adverse effect and while their removal may be effected it is not necessary.

Generally, it has been found desirable that the copper metal be etched in aqueous solution having a hydrogen peroxide concentration between about 2–12%. At solution concentrations less than about 2% by weight etch rates are impractically low and etching unsatisfactory. At concentrations about above 12% by weight it has been found that copper metal may be etched but the dissolution of the etched copper in the etchant causes undesirable decomposition of the hydrogen peroxide with the result that etching at such high concentrations is much less economical. The best results are obtained in solutions having a peroxide concentration between about 2–10%. During the etching process hydrogen peroxide is consumed as more and more amounts of copper are treated. In order to be practical it is necessary that a single etchant solution dissolve a substantial amount of copper metal, usually about 5–7 ounces per gallon of etchant and desirably more, before the solution becomes exhausted to the extent that a particular workpiece cannot be etched within a reasonable time, e.g. 1–2 hours. The hydrogen peroxide solutions useful in etching copper in accordance with the invention, must therefore have an initial hydrogen peroxide concentration of at least about 4%. Desirably, the etchant solution has initially a hydrogen peroxide concentration within the range of about 5–10% by weight. The hydrogen peroxide solutions having the indicated initial hydrogen peroxide concentrations are useful in etching a single large copper piece or a series of workpieces containing limited amounts of copper. The etchant is capable of operating effectively at good etch rates after partial exhaustion and at high dissolved copper concentrations equivalent to at least 7 ounces of copper per gallon and even substantially higher.

The acid employed in etching copper is sulfuric acid. The amount of acid in the hydrogen peroxide etchant is between about 2–23% by weight, preferably between about 3–20% by weight. Below an acid concentration of about 2% the etch rate is slow and peroxide decomposition high, particularly after partial exhaustion of the peroxide bath. Acid concentrations above about 23% are undesirable as resulting unexplainably in nonuniform and incomplete etching. This effect is apparently caused by the formation of a protective coating on substantial portions of the exposed copper surface which is thereby made highly resistant to etching. The influence of the acid concentrations between 2–23% on the copper etch rate has been found interesting and worthy of note. When the acidified hydrogen peroxide etchant solution contains only minor amounts of dissolved copper the effect of acid concentration on etch rate is negligible and the full range of acid concentrations between about 2–23% by weight results in little variance in etch rate. As the peroxide bath becomes more exhausted and dissolved copper concentration increases, the influence of the acid concentration increases markedly. At the higher dissolved copper concentrations both the lower and higher acid concentrations result in longer etch times. An optimum etch rate is indicated at an intermediate concentration between about 4–6% by weight. In the etching of copper with the sulfuric acid-hydrogen peroxide system of the invention both the hydrogen peroxide and sulfuric acid are theoretically consumed at a rate which has been found to be about equimolar. Thus, according to the etching reaction one mol of sulfuric acid is consumed for each mol of peroxide and the acid concentration slowly decreases as the dissolved copper concentration increases. As the acid concentration does not have a substantial effect on etch rate at low dissolved copper concentrations it will be noted that the hydrogen peroxide etchant may contain initially a high acid concentration with relatively little sacrifice of etch rate after partial exhaustion and increase of the dissolved copper concentration. In situations where it is desired to optimize etch rates and employ lower acid concentrations the etchant solution may be advantageously made up to contain initially a low or intermediate acid concentration, of the order of about 2–15% by weight, preferably between about 5–12% by weight. Then, as the etchant is consumed causing reduction of the sulfuric acid additional acid is added to regulate the acid concentration within the optimum range of about 4–6% by weight. Addition of the acid may take place either continuously or intermittently and either immediately after the start of the etching or after significant exhaustion of the etchant solution. When employing a low initial acid concentration of say about 2–5% the addition of the acid preferably takes place substantially immediately after etching commences and is desirably more or less continuous until the acid concentration is increased to well within the range of about 4–6% by weight. When the initial acid concentration is greater than 5% by weight the addition of acid to maintain the optimum concentration preferably takes place from time to time and after the etchant solution has been exhausted to the extent that the acid concentration is below 5%, usually just after the concentration is reduced below about 4% by weight.

In the etchant solution the ratio of hydrogen peroxide to sulfuric acid is less important than the concentration of the acid. As the chemical reaction or mechanism by which copper is etched consumes an equimolar amount of peroxide and sulfuric acid a mol ratio of 1 to 1 is indicated. Peroxide to sulfuric acid mol ratios less than 1 to 1 are therefore generally unnecessary and in fact tend to slow the etch rate, particularly at the higher reagent concentrations. In practice, the amount of hydrogen peroxide actually consumed seldom will exceed about 75% so that the inclusion of just slightly more than 0.75 mol of sulfuric acid per mol of peroxide will be adequate to supply sufficient acid for complete utilization of the particular etchant solution. Therefore, the etchants made up to include sufficient acid to complete utilization without addition of more acid preferably have a hydrogen peroxide to sulfuric acid mol ratio of not less than about 1.0:0.8, and desirably in the range of about 1.0:0.8 to 1.0:0.5. When acid is to be later added and the etchant solution contains initially a low or intermediate acid concentration the mol ratio of peroxide to acid may of course be initially somewhat greater, preferably between about 1.0:0.1 to 1.0:0.5. As hydrogen peroxide is consumed and more sulfuric acid added the mol ratio of peroxide to acid will be reduced and eventually become similar to the mol ratios preferably employed in the solutions made up to contain the complete acid requirement. Again, because peroxide utilization seldom exceeds 75%, it is desirable from a practical viewpoint not to add an amount of acid sufficient to reduce to the mol ratio of peroxide to acid below about 1.0:0.8.

Temperature of the acidified-hydrogen peroxide solution is another important factor in etching copper. As a practical matter copper metal is not etched at room temperatures or below. The nature of the attack of the hydrogen peroxide solution on copper at such temperatures is more of a polishing or brightening effect. In order to etch copper the hydrogen peroxide solution must have a temperature of at least about 40° C. at time of contact with the metal. Solution temperature has a strong effect on etch rates and increasing the temperature to a preferred range between about 50–62° C. will substantially increase the rate of etching to a level significantly greater than heretofore realized with ammonium persulfate etchants at recommended optimum temperatures. At hydrogen peroxide solution temperatures above about 65° C. little further increase in etch rate is realized and such temperatures have been found particularly undesirable as resulting in an impractically high rate of peroxide decomposition. As is the case with sulfuric acid concentration the influence of temperature on etch rate has been found to be greatest after partial exhaustion of the etchant and increase of the dissolved copper concentration. If desired, etching may be commenced at the lower temperatures, for example, between about 40° C. to 55° C., and temperature of the solution then gradually increased up to a higher temperature of approximately 55–62° C. as the solution is further exhausted with a corresponding increase in dissolved copper content. Increasing the temperature of the etchant solution is aided by the etching reaction itself which is moderately exothermic. Increasing the temperature of the etchant may be used to advantage to regulate etch rates at a more or less constant value when a number of pieces are to be etched in the same solution such as, for example, when employing automatic systems used in the manufacture of printed circuits.

A particular feature of the invention is that it may be utilized in that phase of the manufacture of printed circuit boards involving the etching of copper clad laminates to obtain the conductive pattern. Such etching is well-known and need not be described herein in great detail. The laminates from which the circuit boards are produced are usually composed of a thin copper sheet laminated to a base sheet of electrically resistant material which is typically a polymeric vinyl chloride plastic. Other electrically resistant materials to which the copper may be laminated include the phenolic resins and ceramic or glass. Thickness of the copper sheet in such laminates may vary considerably, say from about ¼ mil up to about 10 mils or more, usually between about ½ mil to 5 mils. It is conventional to gauge the thickness and amount of copper in such laminates in terms of ounces of copper per square foot. For example, a laminate having a copper sheet of about 2.7 mils thickness is commonly designated as a 2 ounce copper board. The conductive pattern desired in the board is outlined by a masking or resist material which of course must be highly resistant to attack by the chemical agents employed in the etching step. Several types of resist materials are well-known and available commercially. Among such conventional materials found most suited for use with the peroxide etchant of the invention are Advance Plating Resist R–918–43 supplied by Advance Process Supply Company, Meaker Etch No. 200 supplied by Meaker Co., Sel-Rex Corp., Candoc SS1105, Toluidine Red supplied by Cudner and O'Connor Company, Candoc SS1139, Perma Peacock Blue supplied by Cudner and O'Connor Company, K P Acid Resist No. 250–15 supplied by Kresslik Products Company, Economy White A11632 supplied by Union Ink Company, Printed Circuit Resist Black supplied by Union Ink Company, and Kodak Photo Resist supplied by Eastman Kodak Company. The hydrogen peroxide etchant of the invention is especially suitable for immersion etching in which the resist-applied copper clad laminates are immersed in a bath composed of the etchant solution. Agitation of the bath or workpiece is desirable as conventional in printed circuit etching. Immersion time in the bath is about the same as the contact time required to etch copper generally with the hydrogen peroxide etchant of the invention. In practice, immersion time depends on several factors including particularly thickness or amount of copper to be etched, concentration or extent of exhaustion of the peroxide and acid in the bath, temperature, degree and method of agitation. A thin copper sheet may be etched at the higher permissible temperatures in a freshly made bath of high peroxide concentration in as little as about ¼ minute. Etching of successive boards requires longer times although a number of copper laminates of conventional copper weight may be etched in the peroxide bath over a fairly constant time period which is a desirable feature for many of the etching procedures adapted by the printed circuit industry. Extended immersion times are mostly a matter of economics and capability of the highly exhausted bath to complete the etching within a reasonable period. Immersion for about 60 minutes generally represents the practical upper limit for the hydrogen peroxide etchant of the invention. Immersion times between about ½ to 50 minutes are preferably employed in etching a series of copper laminates of ½ to 5 mil thickness in the manufacture of printed circuits. Etch rates in manufacture of printed circuits may of course also be controlled by regulation of bath temperature and acid concentration as found possible with the peroxide etchant of the invention. Thus, the bath temperature may be slowly increased to provide a more constant etch time in treating a series of copper laminates. Acid concentration in the bath may be minimized and etch rates maximized by employing a bath having initially a low or intermediate acid concentration and, after partial exhaustion, adding more acid to regulate the concentration within the optimum range of about 4–6%. In the etching of printed circuit boards an important consideration is undercut which measures the degree to which the etchant acts horizontally beneath the resist material compared to the desired action vertically toward the underlying plastic base. Undercut is generally defined as a ratio of copper sheet thickness to the amount of horizontal attack under the resist material. A ratio better than 1:1 is desired for satisfactory results. The hydrogen peroxide etchant of the invention has been found highly satisfactory in this respect in demonstrating an undercut ratio of about 2.

The following examples in which parts and percentages are by weight unless otherwise noted demonstrate the practice and advantages of the present invention.

In the following examples copper clad laminates supplied by General Electric Company under trademark "Textolite" (No. 11571) were cut into board specimens having dimensions of 2¼ x 4½ x $\frac{1}{16}$ inch. Each specimen had about 0.14 total ounce of 2.7 mil thick copper laminated to a plastic base. Etching was carried out in 500 gram solutions contained in 500 ml. tall beakers immersed in a water bath for control of the etchant bath temperature. Etching of the specimens having 0.14 ounce of copper in the 500 grams of solution may be reported in terms of etch time at known ounces of copper dissolved per gallon of etchant in which terms the results in the examples are expressed. The specimen to be etched was attached at one of its ends to a reciprocating mechanism adapted to agitate the specimen up and down through a displacement distance of about ½ inch at a rate of about 50–60 strokes per minute. The 500 ml. beakers were charged with 500 grams of acidified hydrogen peroxide solution and etching commenced by introducing the specimen into the resulting peroxide bath while commencing agitation of the specimen. Etch time was determined with a stop watch and etch rate calculated by weighing the specimen before immersion and after withdrawal from the bath.

*Example 1*

A copper clad plastic laminate specimen was immersed in 500 grams of an aqueous solution containing 8% by weight hydrogen peroxide and 23% by weight sulfuric acid. The etchant solution contained 0.2 part per million of total chloride and bromide ions and was prepared by mixing of about 101 parts by volume of 35% aqueous hydrogen peroxide solution, about 65 parts by volume 96% sulfuric acid, and about 265 parts by volume deionized water. Mol ratio of hydrogen peroxide to sulfuric acid was about 1:1. The etchant bath was regulated by the water bath at a temperature of about 60° C. The copper clad laminate specimen was completely etched to expose the surface of the plastic base in the short time of only about 1.5 minutes.

*Example 2–6*

Etching of a series of copper specimens was carried out in the same bath used in Example 1 containing progressively increased amounts of dissolved copper to determine effect of the dissolved copper and bath exhaustion on etch rate. Results summarizing Examples 1–6 are given below in Table 1 and are compared with results reported for etching a series of copper specimens in a commercially recommended ammonium persulfate etching bath containing 20% ammonium persulfate with mercuric chloride catalyst at an etchant bath temperature of 50° C. A similar commercially recommended 20% ammonium persulfate solution containing mercuric chloride was also employed in the same apparatus as used for the hydrogen peroxide etchant for etching a series of the copper specimens at a temperature of 60° C.

TABLE 1

| Concentration | Etch Rate, Minutes | | |
|---|---|---|---|
| Ounces Copper Dissolved Per Gallon at Etchant | 20% Ammonium Persulfate, 60° C. | 20% Ammonium Persulfate, 50° C. | 8% Hydrogen Peroxide, 60° C. |
| Initial etch rate | 24 | 7.5 | 1.5 |
| 2 ounces | 28 | 10.0 | 2.1 |
| 4 ounces | 45 | 14.0 | 3.5 |
| 6 ounces | ---------- | 20.0 | 6.5 |
| 8 ounces | ---------- | 34.0 | 14.0 |
| 10 ounces | ---------- | ---------- | 40.0 |

As shown by Table 1 the immersion bath etch rate for the hydrogen peroxide etchant of the invention is very high and clearly superior to the immersion bath rate for ammonium persulfate at recommended concentrations and temperature. The initial etch rate is 5 times faster than the initial etch rate of the ammonium persulfate solution. Etch rate in the bath containing 4 ounces of dissolved copper is some 4 times greater than with the ammonium persulfate while etching in the peroxide bath containing as much as 8 ounces of dissolved copper ion was more than twice as fast as with the ammonium persulfate. In Examples 2–6 the values given are for various stages of hydrogen peroxide bath exhaustion, i.e. decreased peroxide content with increasing copper ion content. At the various degrees of hydrogen peroxide exhaustion the ratio of peroxide to sulfuric acid in the bath became approximately 1 to slightly greater than 1 due to the stoichiometry of the etching reaction mechanism and the loss of a portion of the hydrogen peroxide due to decomposition. Examination of the residual peroxide bath after etching 10.2 ounces of copper showed a peroxide utilization of 42% with 32% of the original peroxide remaining in the bath and only 26% lost due to peroxide decomposition.

*Example 7*

An etchant solution containing 8% hydrogen peroxide was prepared similar to that in Example 1 except that the mol ratio of hydrogen peroxide to sulfuric acid was reduced to about 1:0.75. The etchant bath contained less than 0.2 part per million total of free chloride and bromide ion and was maintained throughout the etching at a temperature of about 60° C. Initial etch time for the copper specimen was found reduced to about 1.4 minutes compared to about 1.5 minutes for the 8% hydrogen peroxide bath of Example 1 having a peroxide to acid ratio of 1:1. Etching of additional specimens in the bath at progressively increasing copper ion concentrations showed a retention in the etch rate improvement over the bath having the initial peroxide to acid mol ratio of 1:1. Etch time at the equivalent of a 4 ounce copper ion concentration was about 3.0 minutes while etch rate in the bath containing the equivalent of 8 ounces of dissolved copper was about 9.0 minutes. Etch time at the equivalent of 10 ounces of copper was only about 16 minutes.

*Example 8*

An etchant solution containing 8% hydrogen peroxide and having a hydrogen peroxide to sulfuric acid mol ratio of about 1:0.75 was prepared by admixing 101 parts by volume of 35% aqueous hydrogen peroxide solution, 49 parts by volume of 96% sulfuric acid, and 295 parts by volume of ordinary tap water. The etchant after preparation contained at least about 5 parts per million total of free chloride and bromide ion. A copper clad specimen immersed in the etchant solution at 60° C. required greater than 6.5 minutes for completion of the etching compared to the initial etch rate of only 1.5 minutes in the etchant bath of Example 1 having the same formulation but containing less than 0.2 part per million total chloride and bromide ion. After the initial etching the bath containing the high total chloride and bromide concentration was found to exhibit an undesirably high degree of peroxide decomposition and etching of additional copper specimens in the bath showed that increased immersion times were required. The etchant thus had an initial etch rate more than 4 times slower than the etchant of Example 1 containing less than 0.2 part per million chloride and was impractical for high capacity etching.

*Example 9*

Acid concentration was further investigated employing an etchant solution containing 8% hydrogen peroxide and having a peroxide to sulfuric acid mol ratio of about 1 to 1.29. The sulfuric acid concentration in the etching bath was 31% and the total choride and bromide ion concentration less than 0.2 part per million. Etching was carried out at a bath temperature of 60° C. and was found to lack uniformity and to be unsatisfactory. Some copper was etched from the specimen at a relatively high rate approximately the rate of etchant solutions of lower concentrations but large areas almost ½ inch in diameter exhibiting unusual resistance to etching developed on the specimen and were not removed until after extended immersion times.

*Examples 10–41*

Hydrogen peroxide solutions of varying peroxide concentration were prepared and evaluated in etching of the copper clad specimens at different bath temperatures. Each solution had a hydrogen peroxide to sulfuric acid mol ratio of 1:0.75 and contained less than about 0.2 part per million total free chloride and bromide ion. Results summarized below in Tables 2–5 show the influence of bath temperature on the peroxide etching of copper.

TABLE 2.—4% HYDROGEN PEROXIDE CONCENTRATION

| Example No. | Amount of Dissolved Copper | Etch Rate, Minutes | | | |
|---|---|---|---|---|---|
| | | 40° C. | 50° C. | 60° C. | 70° C. |
| 10–13 | Initial | 15.0 | 10.3 | 6.7 | 4.5 |
| 14–17 | 6 ounces | 75.0 | 43.0 | 31.0 | 30.0 |

TABLE 3.—6% HYDROGEN PEROXIDE CONCENTRATION

| Example No. | Amount of Dissolved Copper | Etch Rate, Minutes | | | |
|---|---|---|---|---|---|
| | | 40° C. | 50° C. | 60° C. | 70° C. |
| 18–21 | Initial | 8.2 | 5.5 | 3.0 | 1.8 |
| 22–25 | 6 ounces | 27.5 | 17.4 | 9.5 | 6.6 |

TABLE 4.—8% HYDROGEN PEROXIDE CONCENTRATION

| Example No. | Amount of Dissolved Copper | Etch Rate, Minutes | | | |
|---|---|---|---|---|---|
| | | 40° C. | 50° C. | 60° C. | 70° C. |
| 26–29 | Initial | 6.2 | 3.5 | 1.7 | 0.9 |
| 30–33 | 6 ounces | 17.0 | 7.7 | 4.7 | 2.8 |

TABLE 5.—10% HYDROGEN PEROXIDE CONCENTRATION

| Example No. | Amount of Dissolved Copper | Etch Rate, Minutes | | | |
|---|---|---|---|---|---|
| | | 40° C. | 50° C. | 60° C. | 70° C. |
| 34–37 | Initial | 5.0 | 1.5 | 0.7 | 0.5 |
| 38–41 | 6 ounces | 16.0 | 4.0 | 2.0 | 1.4 |

As shown by Tables 2–5, above, the etch rate generally increased with increasing bath temperature. The initial etch rate in the presence of little or no copper is significantly slower at 40° C. than at the high temperatures. Etch rate at 50° C. is some 46–233% faster than at 40° C. while etch rate at 60° C. is about 124–614% greater than at 40° C. In the partially exhausted baths containing 6 ounces of accumulated dissolved copper the etch rate at 50° C. is 58–300% faster than at 40° C. while etch rate at 60° C. is about 142–700% greater than at 40° C. Tables 2–5 also show that the etch rates for the 8% and 10% peroxide baths are approximately the same, indicating that a maximum has been reached and that little or no additional increase in etch rate would be realized at a given bath temperature by increasing the initial hydrogen peroxide concentration. Relatively little improvement in etch rate is shown on increasing the bath temperature to 70° C. Etching at such temperature was found wholly impractical because of excessive decomposition of the peroxide on increase in copper concentration and because of the resulting substantial loss in peroxide efficiency.

*Example 42*

The bath employed contained a high 13.5% hydrogen peroxide with the peroxide to acid ratio set at about 1:0.52 so that initial sulfuric acid concentration did not exceed about 20%. The bath contained less than 0.25 part per million total chloride and bromide ion and was regulated at a temperature of about 60° C. The initial etch rate for a copper clad specimen was about 0.7 minute showing virtually no increase over the 8–10% peroxide baths at the same temperature. Further etching in the same bath caused a high impractical rate of peroxide decomposition. Examination of the residual peroxide bath after etching 9.8 ounces of copper showed a peroxide utilization of 27% with 23% of the original peroxide remaining in the bath and a high 50% lost due to peroxide decomposition.

Although certain preferred embodiments of the invention have been disclosed for purpose of illustration, it will be evident that various changes and modifications may be made therein without departing from the scope and spirit of the invention.

We claim:

1. The method of chemically treating copper which comprising contacting the copper for a period of time between about ¼ to 60 minutes at a temperature within the range of about 40–65° C. with a solution of 2–12% by weight hydrogen peroxide and 2–23% by weight sulfuric acid in water having a total free chloride and bromide ion content less than 2 parts per million.

2. The method of claim 1 in which the acidified aqueous hydrogen peroxide solution has a temperature between about 50–62° C.

3. The method of chemically treating copper which comprises immersing the copper for a period of time between about ¼ to 60 minutes at a temperature within the range of about 50–65° C. in a solution of 2–10% by weight hydrogen peroxide and 3–20% by weight sulfuric acid in water having a total free chloride and bromide ion content less than 1 part per million.

4. The method of claim 3 in which the acidified aqueous hydrogen peroxide solution has a hydrogen peroxide to sulfuric acid mol ratio within the range of 1.0:0.8 to 1.0:0.5.

5. The method of chemically treating copper which comprises contacting the copper with an aqueous solution of 2–12% by weight hydrogen peroxide and between about 2–15% by weight sulfuric acid having a total free chloride and bromide ion content less than 2 parts per million and a temperature within the range of about 40–65° C. to dissolve said copper in said solution and simultaneously reduce the sulfuric acid concentration, adding to said solution additional sulfuric acid to regulate the acid concentration between about 4–6% by weight, and continuing the treatment of copper with said solution at a temperature between about 40–65° C.

References Cited by the Examiner

UNITED STATES PATENTS

| | | | |
|---|---|---|---|
| 2,154,451 | 4/1939 | Hull | 252—79.2 |
| 2,154,455 | 4/1939 | Kepfer | 252—79.2 |
| 2,318,559 | 5/1943 | Percival | 148—8 |
| 2,758,074 | 8/1956 | Black | 156—18 XR |
| 2,860,039 | 11/1958 | Margulies et al. | 156—18 |
| 2,923,608 | 2/1960 | Margulies | 156—18 |

ALEXANDER WYMAN, *Primary Examiner.*

JACOB STEINBERG, *Examiner.*